United States Patent [19]
Young-Cheol

[11] Patent Number: 5,220,990
[45] Date of Patent: Jun. 22, 1993

[54] ELECTRONIC PART CARRYING APPARATUS

[75] Inventor: Choi Young-Cheol, Suwon, Rep. of Korea

[73] Assignee: Samsung Electronics Co., Ltd., Suweon, Rep. of Korea

[21] Appl. No.: 828,188

[22] Filed: Jan. 30, 1992

[30] Foreign Application Priority Data

Jan. 31, 1991 [KR] Rep. of Korea .................. 91-1469

[51] Int. Cl.⁵ .............................................. B65G 47/24
[52] U.S. Cl. .................... 198/375; 198/463.4; 198/409
[58] Field of Search .................. 198/375, 463.4, 409

[56] References Cited

U.S. PATENT DOCUMENTS 4,813,573  3/1989  Anderson .............. 198/463.4 X
4,874,078  10/1989  Meyer ...................... 198/409

FOREIGN PATENT DOCUMENTS 1-156216  6/1989  Japan .
383721  4/1991  Japan .................... 198/409

Primary Examiner—David H. Bollinger
Attorney, Agent, or Firm—Burns, Doane, Swecker & Mathis

[57] ABSTRACT

An electronic part carrying apparatus is disclosed. If a carrier means moves to a part supplying device (which supplies electronic parts in a laid-down state) in accordance with the actuation of a rodless cylinder, a first roller is lifted along an upper inclined face of a first guide member in order to load electronic parts into a loading means. If the carrier means is moved in the opposite direction in accordance with the actuations of the rodless cylinder, a second roller is guided along a lower inclined face of a second guide member in order to pivot the loading means by 90 degrees. Consequently, the electronic parts are erected to an upright posture, with the result that the chucking is rendered easier, and that the working time is shortened.

13 Claims, 6 Drawing Sheets

ELECTRONIC PART CARRYING APPARATUS

FIELD OF THE INVENTION

The present invention relates to an electronic part carrying apparatus by which electronic parts to be installed on a printed circuit board are carried from an electronic parts supplying device to a chucking position so as for a robot to easily chuck them, and particularly to an electronic part carrying apparatus in which a robot can easily chuck the electronic parts, even in the case where the electronic parts have irregular shapes or are too large.

BACKGROUND OF THE INVENTION

A conventional electronic part carrying apparatus is disclosed in Japanese Patent Laid-Open No. Hei-1-156216 which is constituted as shown in FIG. 5. As shown in this drawing, this apparatus includes: a pressing means 2 for conveying an electronic part A contained in a magazine 1; a stopper 4 for sending the the electronic part A to a work supporting section 3 (elastically installed); a carrying section 7 for horizontally transferring the work supporting section 3 to an inspecting or processing apparatus 6 by the help of a driving source 5; and a chute section 9 for lifting the the carrying section 7 in accordance with the actuations of a driving cam 8.

If the electronic part A is supplied to the work supporting section 3 by the stopper 4, then the work supporting section 3 is moved horizontally and upwardly in accordance with the actuations of the driving source 5 and the driving cam 8, thereby carrying the electronic parts to the inspecting or processing apparatus.

There is known another electronic part carrying apparatus as shown in FIG. 6, and, as shown in this drawing, this apparatus includes: a part supplying device B installed in an inclined posture in order to supply the electronic part A; a carrier member C installed at a side of the part supplying device B in such a manner as to perform reciprocating movements to the left and right; and a loading means D installed above the carrier member C in order to carry the electronic part A.

In the conventional apparatuses as described above, there can be expected convenience in handling the parts to a certain degree. However, if the parts are too large or have irregular shapes, the conventional method is not capable of handling the parts in the upright posture because of the provision of lead frames on the parts. Therefore, if the parts are too large or have irregular shapes, they can not be loaded on the carrying device, but have to be handled manually or by a separate sophisticated apparatus, with the result that the manufacturing cost is increased.

SUMMARY OF A PREFERRED EMBODIMENT OF THE INVENTION

The present invention is intended to overcome the above described disadvantages of the conventional techniques.

Therefore it is the object of the present invention to provide an electronic part carrying apparatus in which electronic parts can be conveyed to a chucking position so as for a robot to chuck them even in the case of too large parts or irregularly shaped parts, before installing them on a printed circuit board, so that the working hour should be shortened, that the productivity should be improved, and theat the manufacturing cost should be reduced.

In achieving the above object, the electronic part carrying apparatus according to the present invention includes: a part supplying device for supplying electronic parts in accordance with the actuations of a cylinder, and having a chute loaded with parts in an aligned and laid-down state; a rodless cylinder installed at a side of the part supplying device in such a manner as to be actuable to the left and right; a fixed member fixedly secured to a side of the rodless cylinder; a loading means hinge-coupled with a supporting member (fixedly secured on the top of the fixed member), and for loading an electronic part within itself; a guide plate fixedly secured on the bottom of the loading means, and with first and second rollers being rotatably installed thereon; a first guide member projected from a side of the part supplying device, and having an inclined face in order to guide the first roller; and a second guide member projected from the other side of the part supplying device, and for pivoting the loading means by 90 degrees after guiding the second roller.

According to the electronic part carrying apparatus of the present invention, if an electronic part is loaded on the loading means after being carried to the part supplying device by the carrier means, the guide plate is pivoted a certain angular distance by being guided by the first guide member for the part to be placed on the chute of the part supplying device, with the result that the part which is supplied in a laid-down posture is easily loaded into the loading means, and that the part is thus carried to the position where a robot can easily chuck it.

If the carrier means is moved to the chucking position, the loading means is pivoted by 90 degrees by the second guide member, and, at the same time, the electronic part which is loaded on the loading means is also pivoted by 90 degrees, so that the chucking means of a robot should be able to chuck the part before installing it to a printed circuit board.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
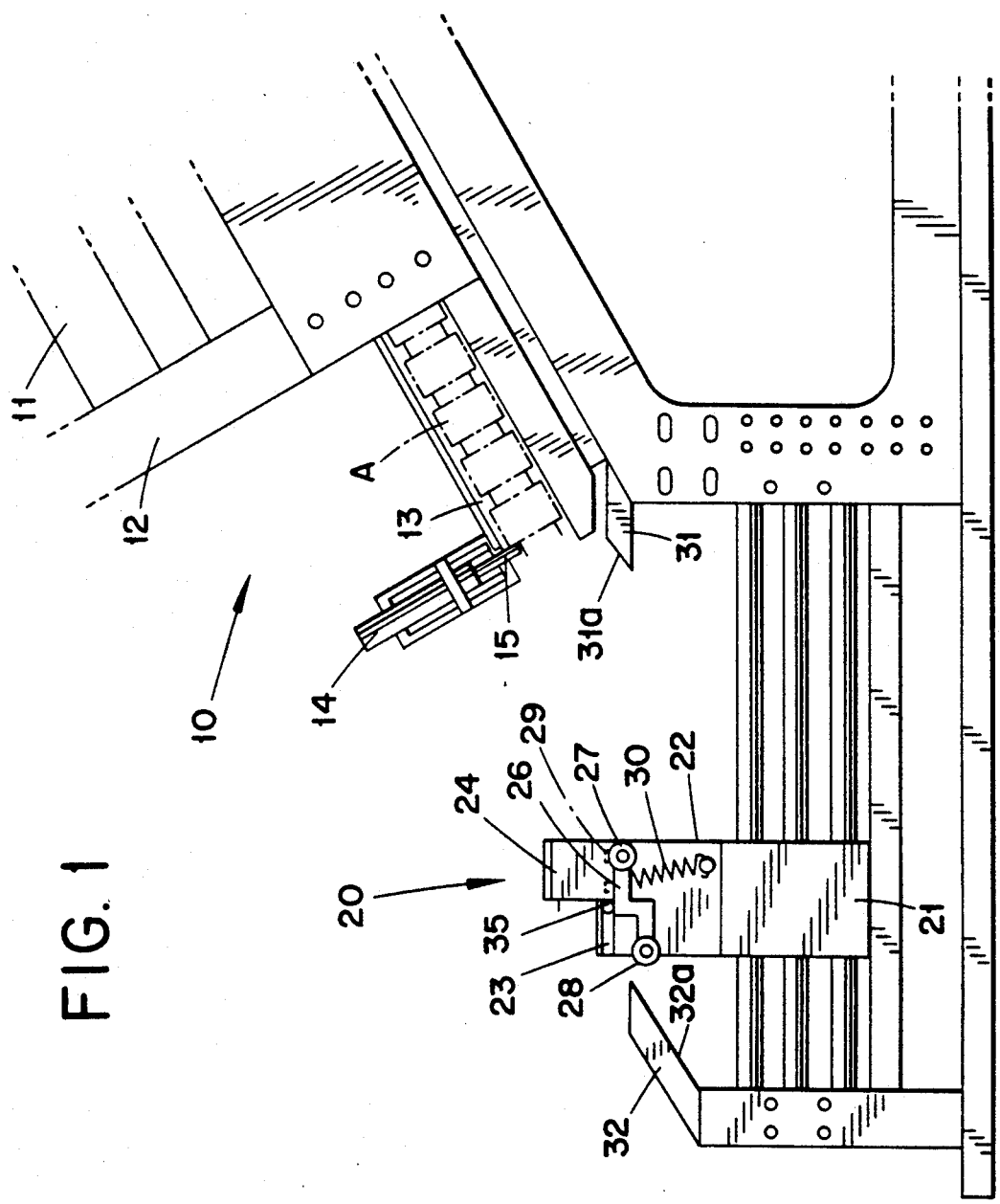
FIG. 1 is a side view of a first embodiment of the electronic part carrying apparatus according to the present invention.

In the drawings, reference numeral 10 indicates a part supplying device for supplying electronic parts A in a laid-down posture.

The part supplying device 10 is provided with a chute section 13 in an inclined form, and the chute section 13 supplies electronic parts A gravitationally from its loading section 12, the parts being mounted on rods 11.

At the leading end of the chute 13, there is installed a stopper 15 which ascends and descends in accordance with the actuations of a cylinder 14 in order to supply the electronic parts A which are placed in an arranged form.

Figure 2:
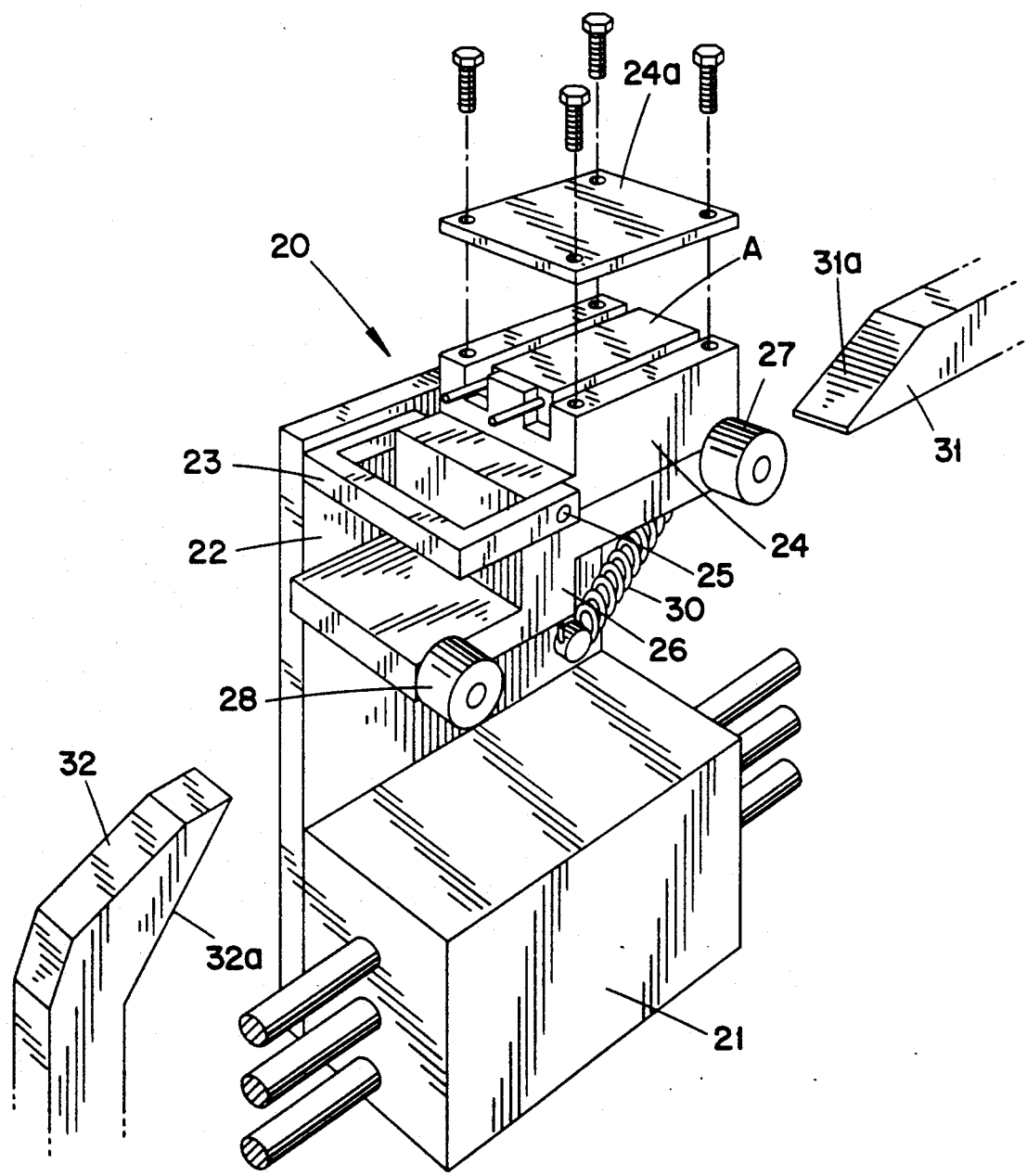
FIG. 2 is an exploded perspective view showing the apparatus of the present invention.

At a side of the part supplying device 10, there is installed a carrier means 20 in such a manner as to be capable of performing reciprocating movements to the left and right, and the carrier means 20 performs horizontally reciprocating movements in accordance with the actuation of a rodless cylinder 21 as shown in FIG. 2.

A flat fixed support member 22 is fixedly secured to a side of the rodless cylinder 21, and a supporting member 23 is fixedly secured to the top of the fixed member 22. The supporting member 23 is hinge-coupled be a loading means 24 by means of a hinge pin 25, and the loading means 24 is for loading the electronic parts A after the supplying of them from the part supplying device 10, while a guide plate 26 is secured to the lower portion of the loading means 24.

The arranged electronic parts A are supplied to the loading means 24 in a laid-down posture, and, on the top of the loading means, there is secured a covering plate 24a, so that there should be formed a space for receiving the electronic parts A.

The guide plate 26 which is secured on the bottom of the loading means 24 is provided with a first cam follower roller 27 on a side thereof in a freely rotatable manner, and is also provided with a second cam follower roller 28 on the other side thereof in a freely rotatable manner.

The guide plate 26 is secured on the bottom of the loading means 24 by means of bolts 29 so as to be detachable, and an elastic member 30 is elastically installed on the bottom of the guide plate 26 and at a side of the fixed member 22.

At a side of the part supplying device 10 and at a position opposite to the first roller 27, there is fixedly installed a first guide member 31 with an upper inclined can face 31a formed thereon, while at the other side of the part supplying device 10, and at a position opposite to the second roller 28, there is fixedly installed a second guide member 32 with a lower inclined cam face 32a formed thereon.

The apparatus of the present invention constituted as described above will now be described as to its operation and effects.

Figure 3:
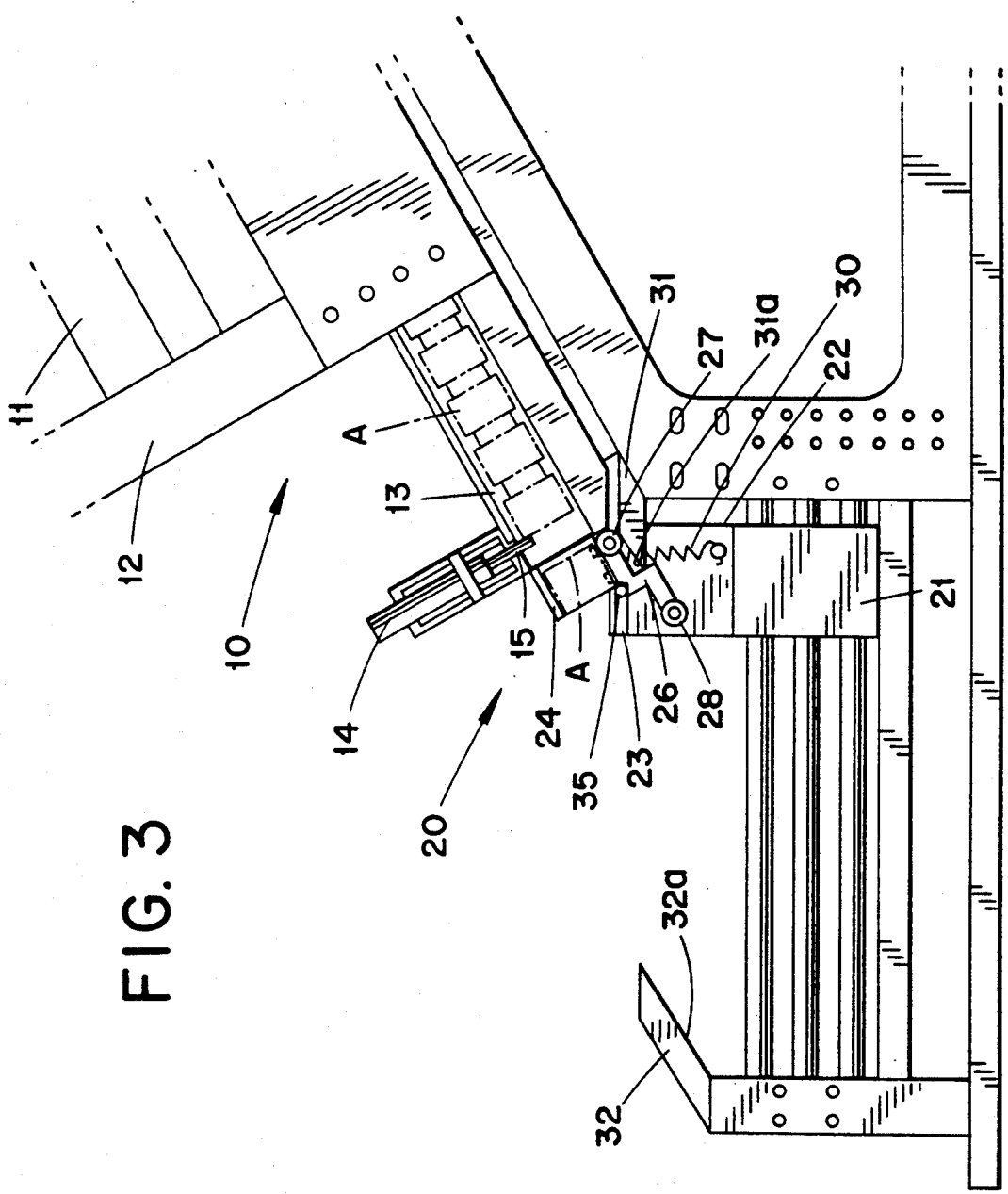
FIG. 3 is a view similar to FIG. 1 in which the loading means of the present invention is loading an electronic part.

First, if the carrier means 20 moves toward the part supplying device 10 in accordance with the actuations of the rodless cylinder 21, then as shown in FIG. 3, the first roller 27 which is installed at a side of the guide plate 26 moves along the upper inclined face 31a of the first guide member 31, so that the loading means 24 should be pivoted from a rest position around the hinge pin 25 to a predetermined angular distance, and that the loading means 24 should be positioned in a part receiving position at the leading end of the chute section 13 of the part supplying device 10.

Under this condition, the cylinder 14 is activated by a control means (not shown) to lift up the stopper 15, then the electronic parts A which are supplied in a laid-down state depart from the chute section 13 to be loaded into the loading means 24.

Figure 4:
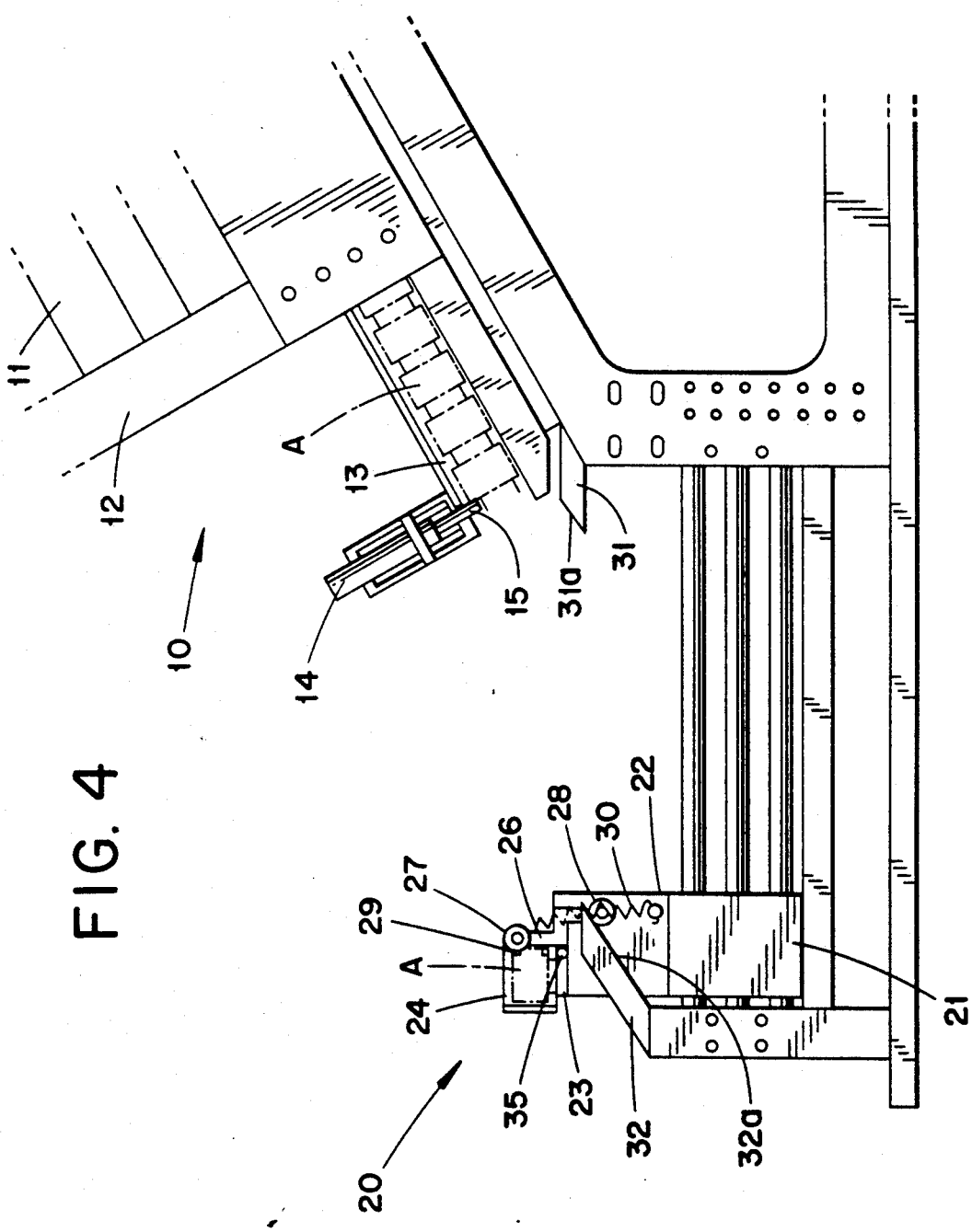
FIG. 4 is a view similar to FIG. 1 in which the loading means of the present invention is pivoted by 90 degrees.
Figure 5:
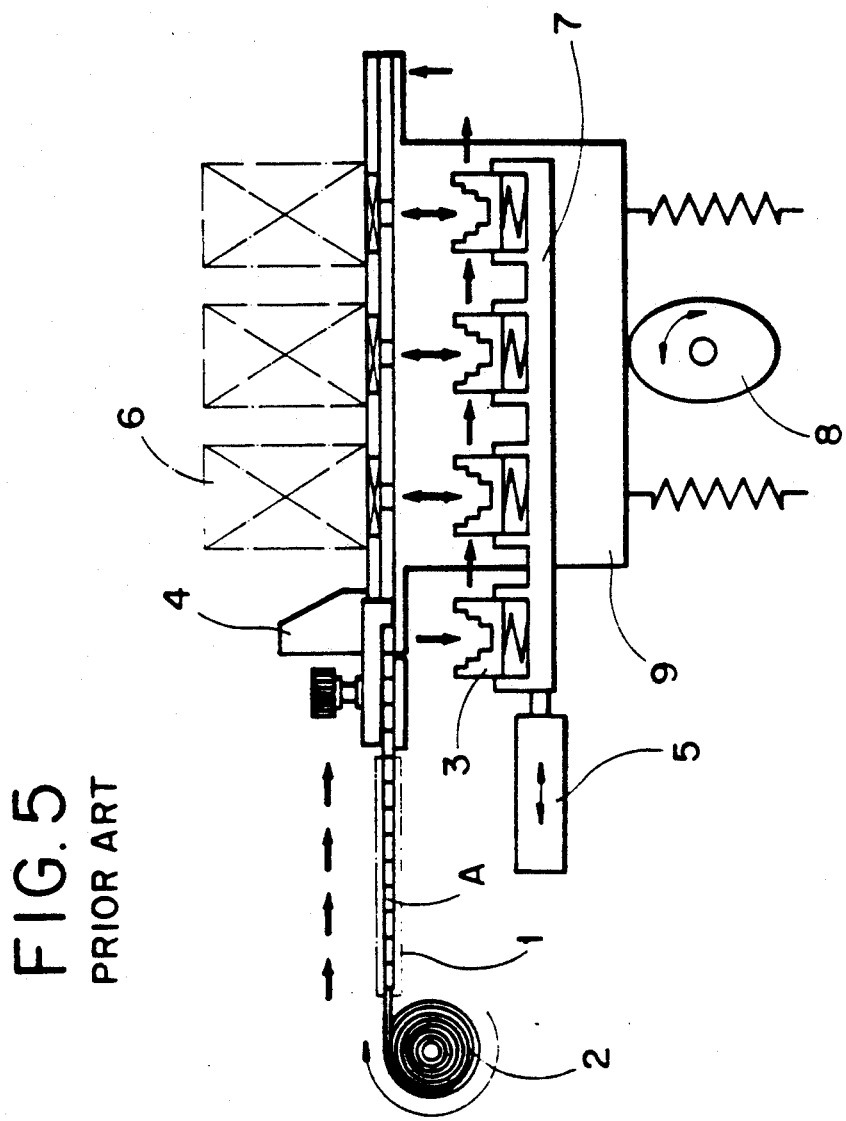
FIGS. 5 and 6 are side views of first and second conventional electronic part carrying apparatuses, respectively.
Figure 6:
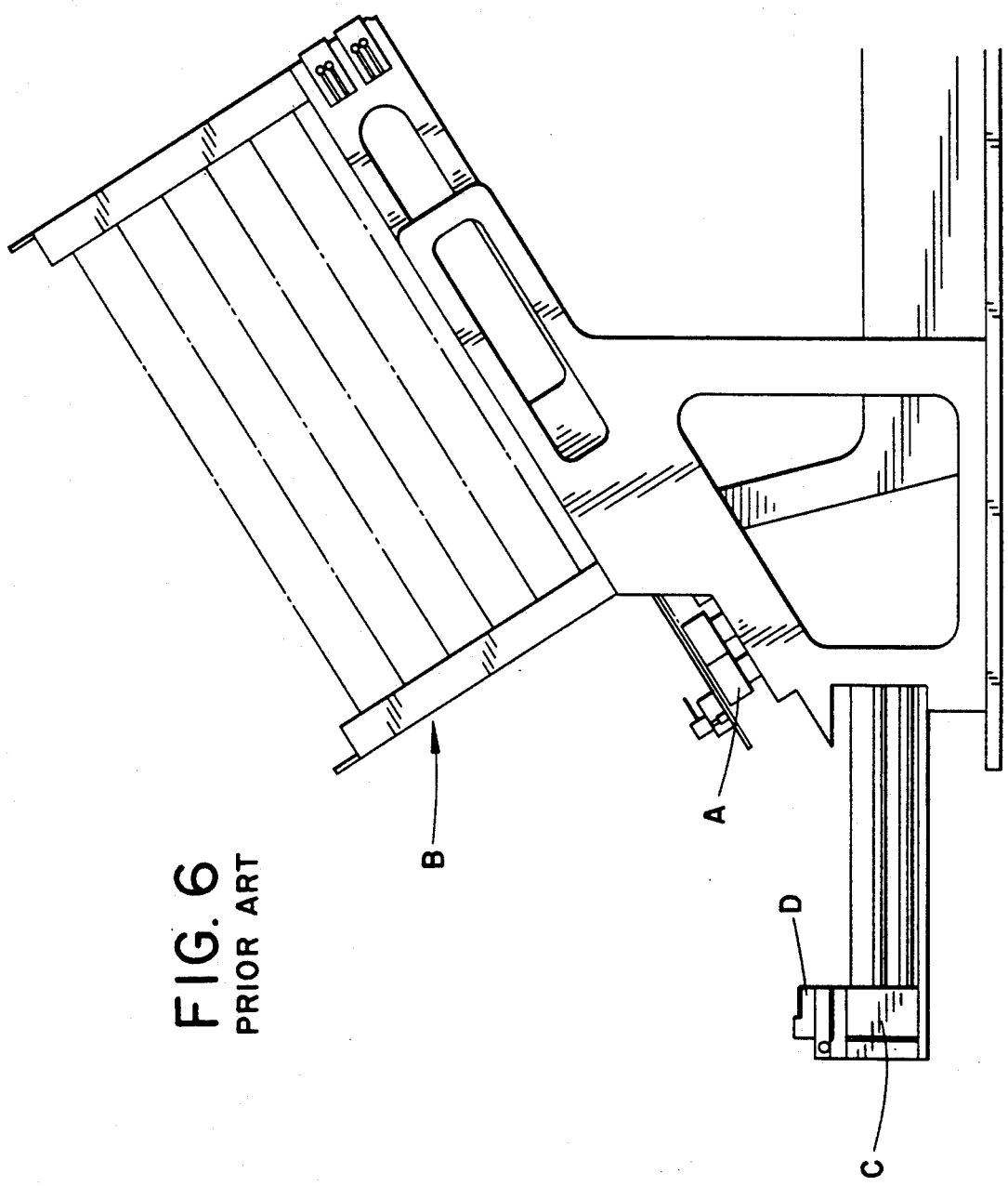

Then, if the carrier means 20 is moved in the opposite direction by the rodless cylinder 21, then the loading means 24 is restored to the original or rest position by the elastic member 30, and, at the same time, the second roller 28 which is installed at a side of the guide plate 26 moves along the lower inclined face 32a of the second guide member 32 as shown in FIG. 4. Consequently, the loading means 24 is pivoted by 90 degrees around the hinge pin 25 to a part transfer or chucking position, so that the electronic parts A placed within it should be shifted to an upright posture, thereby making it possible for the chucking means of a robot to chuck them before installing them on a printed circuit board.

Thus, if an electronic part A is chucked from the loading means 24, the rodless cylinder 21 so operates as to move the carrier means 20 to the part supplying device 10 in order to receive another electronic part A. Under this condition, the loading means 24 is restored to the original position by the elastic member 30, and such cycles of operations are repeated, thereby making it possible to supply and carry electronic parts continuously and in an efficient manner.

According to the electronic part carrying apparatus of the present invention as described above, even in the case where the electronic parts are too large or have irregular shapes requiring them to be supplied in a laid-down state, the parts are carried to a chucking position so as for the chucking means of a robot to chuck them. Further, the electronic parts are placed at the chucking position in an upright posture after being pivoted by 90 degrees, and therefore, the chucking means of a robot can easily chuck them before installing them to a printed circuit board, with the result that the working time is shortened, that the manufacturing cost is saved, and that the productivity is improved.

What is claimed is:

1. A part carrying apparatus,
a part supplying structure including:
   a part introducing side having an inclined chute along which parts are downwardly slidable, and
a part removing side spaced from said part introducing side;
carrier means movable between said part introducing side and said part removing side and including a rotatable loading means for receiving a part, said loading means being rotatable between a part receiving position and a part transfer position;
displacing means for displacing said carrier means between said part introducing side and said part removing side; and
positioning means for positioning said loading means in said part receiving position in general alignment with said chute when said carrier means is at said part introducing side in order to receive a part, and for positioning said loading means in said part transfer position when said carrier means is at said part removing side, said positioning means comprises first and second cam means disposed at said part introducing side and said part removing side, respectively; said loading means including cam follower means for being displaced by said first and second cam means.

2. Apparatus according to claim 1, wherein each of said first and second cam means comprises an inclined surface.

3. Apparatus according to claim 2, wherein said inclined surface of said first cam means has an inclination substantially the same as that of said chute.

4. Apparatus according to claim 1, wherein said first and second cam means displaces said loading means against the bias of a biasing means.

5. Apparatus according to claim 1, wherein said loading means is biased to a rest position by a biasing means and is rotatable from said rest position to said part receiving position in a first direction of rotation and is rotatable from said rest position to said part transfer position in said direction of rotation.

6. Apparatus according to claim 5, wherein said loading means is rotatable less than ninety degrees from said rest position to said part receiving position and is rotatable by about ninety degrees from said rest position to said part transfer position.

7. Apparatus according to claim 1 including general horizontal means for guiding movement of said carrier means between said part introducing side and said part removing side.

8. Apparatus according to claim 7, wherein said carrier means includes a support, said loading means being rotatably mounted to said support by a substantially horizontal pivot pin.

9. Apparatus according to claim 1, wherein said carrier means comprises a support, said loading means being pivotably mounted to said support and removable therefrom.

10. Apparatus according to claim 1, wherein said cam follower means comprises rollers.

11. An electronic part carrying apparatus comprising:
a part supplying structure including:
a part introducing side having an inclined chute along which parts are downwardly slidable, and
a part removing side spaced horizontally from said part introducing side,
carrier means movable between said part introducing side and said part removing side and including:
a support,
loading means rotatably mounted to said support for rotation about a substantially horizontal axis between a part receiving position and a part transfer position and
elastic biasing means for biasing said loading means away rom said part receiving position and said part transfer position;
displacing means for displacing said carrier means between said part introducing side and said part removing side;
first cam means disposed at said part introducing side for rotating said loading means against said elastic biasing means to said part receiving position in general alignment with said chute, in order to receive a part; and
second cam means disposed at said part removing side for rotating said loading means against said elastic biasing means to said part transfer position.

12. An part carrying apparatus, comprising:
a part supplying structure including:
a part introducing side having an inclined chute along which parts are downwardly slidable, and
a part removing side spaced from said part introducing side,
carrier means movable between said part introducing side and said part removing side and including a rotatable loading means for receiving a part, said loading means being rotatable between a part receiving position and a part transfer position;
displacing means for displacing said carrier means between said part introducing side and said part removing side;
positioning means for positioning said loading means in said part receiving position in general alignment with said chute when said carrier means is at said part introducing side in order to receive a part, and for positioning said loading means in said part transfer position when said carrier means is at said part removing side; and
generally horizontal means for guiding movement of said carrier means between said part introducing side and said part removing side.

13. A part carrying apparatus, comprising:
a part supplying structure including:
a part introducing side having an inclined chute along which parts are downwardly slidable, and
a part removing side spaced from said part introducing side,
carrier means movable between said part introducing side and said part removing side and including a support and a rotatable loading means for receiving a part, said loading means being pivotally mounted to said support for movement between a part receiving position and a part transfer position, said loading means being removable from said support;
displacing means for displacing said carrier means between said part introducing side and said part removing side; and
positioning means for positioning said loading means in said part receiving position in general alignment with said chute when said carrier means is at said part introducing side in order to receive a part, and for positioning said loading means in said part transfer position when said carrier means is at said part removing side.

* * * * *